United States Patent
Parent et al.

(10) Patent No.: US 7,095,642 B1
(45) Date of Patent: Aug. 22, 2006

(54) METHOD AND CIRCUIT FOR REDUCING DEFECT CURRENT FROM ARRAY ELEMENT FAILURES IN RANDOM ACCESS MEMORIES

(75) Inventors: Richard Parent, Shelburne, VT (US); David Chapman, Shelburne, VT (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 10/799,742

(22) Filed: Mar. 12, 2004

Related U.S. Application Data

(60) Provisional application No. 60/458,036, filed on Mar. 27, 2003.

(51) Int. Cl.
 *G11C 5/02* (2006.01)

(52) U.S. Cl. .......................... 365/51; 365/96; 365/200; 365/225.7

(58) Field of Classification Search ............. 365/225.7, 365/96, 200
See application file for complete search history.

(56) References Cited

U.S. PATENT DOCUMENTS

| | | | |
|---|---|---|---|
| 4,500,974 A | 2/1985 | Nagami | |
| 5,146,429 A * | 9/1992 | Kawai et al. | 365/200 |
| 5,255,234 A * | 10/1993 | Seok | 365/210 |
| 5,673,231 A * | 9/1997 | Furutani | 365/203 |
| 5,896,334 A | 4/1999 | Casper et al. | |
| 6,246,627 B1 * | 6/2001 | Yamauchi et al. | 365/229 |
| 6,388,927 B1 | 5/2002 | Churchill et al. | |
| 6,462,998 B1 * | 10/2002 | Proebsting | 365/205 |
| 6,519,193 B1 * | 2/2003 | Nakano | 365/200 |
| 6,590,819 B1 * | 7/2003 | Baum et al. | 365/203 |
| 6,603,701 B1 | 8/2003 | Mizugaki et al. | |
| 6,646,934 B1 * | 11/2003 | Sakata | 365/200 |
| 6,850,454 B1 * | 2/2005 | Kuge et al. | 365/227 |

\* cited by examiner

*Primary Examiner*—Son Mai
(74) *Attorney, Agent, or Firm*—Bradley T. Sako

(57) ABSTRACT

A defect current contribution elimination technique may be suitable for dynamic random access memories (DRAMs) and other memory devices. A defect current can be eliminated by using an isolation circuit (106) between bitlines (102-0 and 102-1) and an associated sense amplifier circuit (104). Isolation circuit (106) can be controlled by programmable elements, such as fusible links, which are blown at wafer test to isolate the defective bitlines from the sense amplifier circuit. Isolated, defective bitlines may initially float, but based upon the type of defect, such bitlines can be resistively tied to another element, and as a result no DC current will flow. According to another implementation, controllable devices are placed between wordlines (206) and the wordline driver circuits (226-$y$). A current path through a defective wordline can be similarly cut-off.

15 Claims, 5 Drawing Sheets

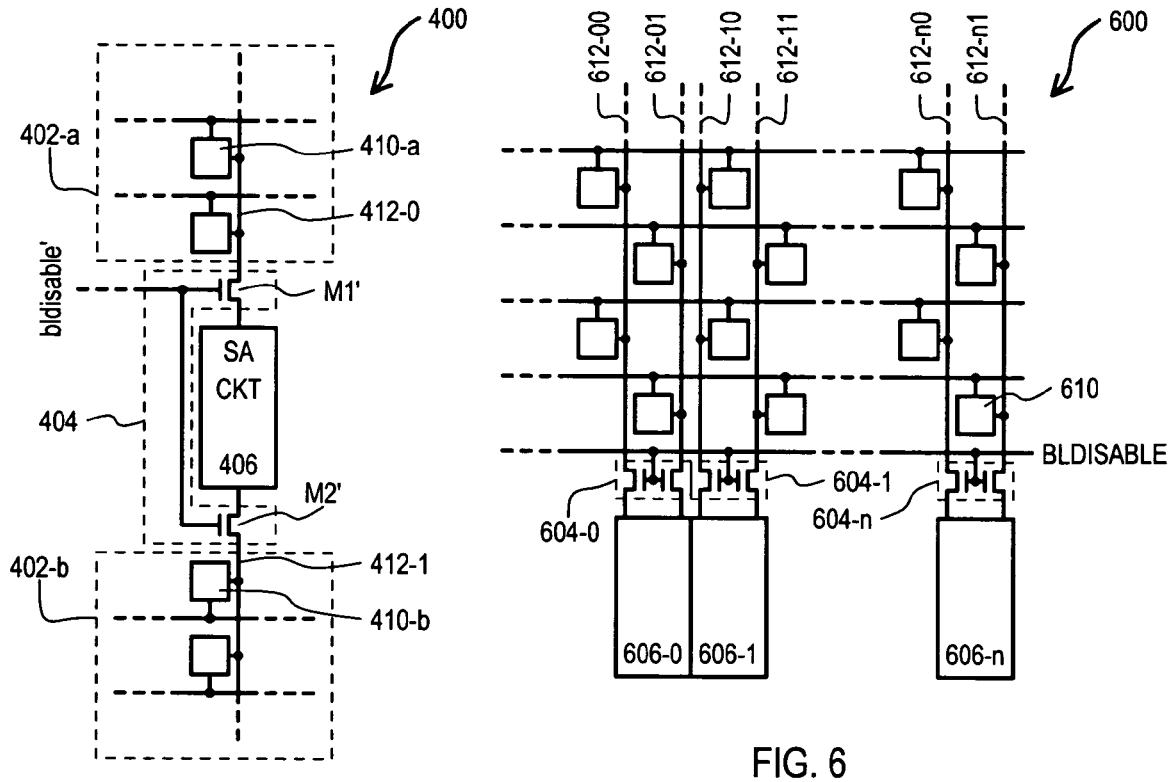
FIG. 4
FIG. 6
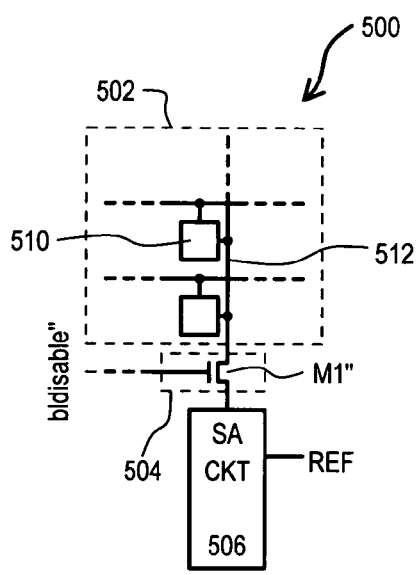
FIG. 5
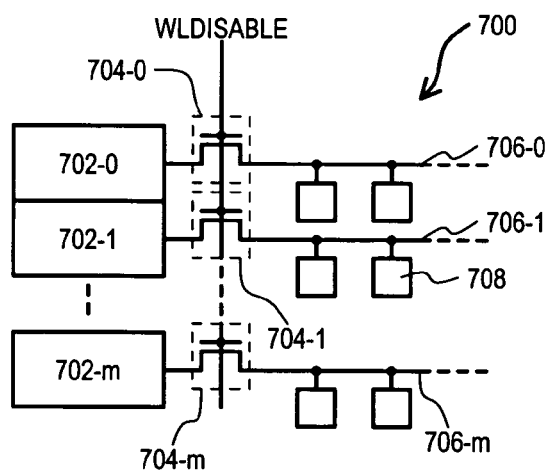
FIG. 7

US 7,095,642 B1

METHOD AND CIRCUIT FOR REDUCING DEFECT CURRENT FROM ARRAY ELEMENT FAILURES IN RANDOM ACCESS MEMORIES

This application claims the benefit of provisional patent application Ser. No. 60/458,036 filed on Mar. 27, 2003.

TECHNICAL FIELD

The present invention relates generally to memory chip defect correction and, more particularly, to reducing a standby current contribution due to defects.

BACKGROUND OF THE INVENTION

Conventionally, memory devices, including but not limited to dynamic random access memories (DRAMs), static RAMs (SRAMs), and electrically erasable and programmable read only memories (EEPROMs) are manufactured with a certain amount of spare elements (i.e., "redundant" wordlines and/or bitlines) available for use as replacements for defective wordlines and/or bitlines.

Such an arrangement can allow memory devices (e.g., chips) that include defects to be fully functional by replacing defective elements with redundant elements. Such defects can arise due to uncontrollable process variations, as but one example. Once defects are replaced, the resulting memory device can have the appearance of an essentially perfect or fully functional chip to an end customer/user.

As would be understood from the above, redundant elements can also significantly improve the device yield, particularly for a product manufactured during the early stages of process development.

A typical memory device can include one or more array regions, each of which can include memory cells arranged in an array along with wordlines and bitlines connected to such memory cells. In most conventional memory devices, bitlines provide a column-wise access to memory cells while wordlines provide a row-wise access to memory cells.

Currently, memory devices can suffer from a variety of failure types that can be repaired by replacing defective elements with redundant elements. Some of the more classical or common types of failures in DRAM devices include: single cell failures, single bitline or wordline fails, bitline-to-bitline shorts, wordline-to-wordline shorts, and wordline-to-bitline shorts. Of course, other types of memory devices can suffer from such defects as well.

After being replaced, different types of failures can have different effects on the operation of a memory device. For example, after being replaced, defective elements may still draw current during operation resulting in a defect current component to overall current consumption in the device.

Typically, single cell, single bitlines and single wordline fails do not drain current from the chip supply after being replaced due to the more self-contained nature of these defects.

However, the remaining three failure types: bitline-to-bitline shorts, wordline-to-wordline shorts, and wordline-to-bitline shorts, are usually a main defect current contributor to a DRAM or other memory type design. That is, even though a defective element may be replaced in a logical or functional sense, the defective element may still draw supply current after being replaced.

A conventional methodology for limiting current drawn by replaced defective elements utilizing current limiter type devices. One example of such a conventional approach is set forth in FIG. 9.

FIG. 9 is a schematic diagram of a portion of a DRAM device designated by the general reference character 900. Conventional DRAM portion 900 includes a memory cell array section 902, a complementary bitline pair composed of "true" bitline 904-0 and "complement" bitline 904-1, and a number of wordlines 906 (WL<3> TO WL<0>). Also shown are a bitline equalization circuit 908 and a sense amplifier circuit 910.

A bitline equalization circuit 908 can equalize complementary bitline pair (904-0 and 904-1) to an equalization voltage (vbleq) prior to a data sense/write operation. In a data sense/write operation, a sense amplifier circuit 910 can amplify a voltage differential between bitlines (904-0 and 904-1) and thereby sense a stored data value or drive a write data value. In a standby mode of operation, bitlines (904-0 and 904-1) can be maintained at a constant voltage (e.g., vbleq), or may be driven in periodic refresh operations.

If a defect exists within the portion 900, the portion 900 can be replaced by another redundant section (not shown) of the same DRAM device. However, in the event the defect results in a bitline (904-0 or 904-1) being shorted to some other element in the device, a current may be drawn from the equalization voltage source (vbleq).

A conventional approach to limiting the standby current drawn from an equalization voltage source (vbleq) is to include a bitline current limiter device between the bitline equalization circuit 908 and the equalization voltage source (vbleq). Such a device 912 may be designed (e.g., sized) to limit a maximum amount of current that can be drawn.

In many conventional DRAM applications, a relatively high standby current specification exists, so the above described conventional method can be satisfactory. However, in other types of DRAM designs, newer memory generations, and/or memories for particular low power applications, a standby current specification can be relatively low.

One particular application in which a low standby current can be desirable is a pseudo static random access memory (PSRAM) application. A PSRAM typically has a one transistor (1-T) cell configuration. Thus, a 1-T PSRAM is a one-transistor cell DRAM-type memory designed to emulate other types of SRAMs. A key goal of many 1T-PSRAM designs is maintaining low current during standby mode. Unfortunately, the above described conventional current limiting method can result in undesirably low yields in the case of 1-T PSRAMs, as array type defects can result in an overall standby current (Isb2) that exceeds the lower threshold of a standby current specification.

A standby current in a 1-T PSRAM may have several components:

(i) Iref: the current required to maintain data in the storage cell capacitor;

(ii) Icircuit: the current drained from circuits that must remain active during standby mode;

(iii) Idevice: the sub threshold current through all the devices in the design; and (iv) Idefect: the current due to shorts caused by defects that occur during the processing of the design.

In light of the above, it would be desirable to arrive at some way of reducing the defect current contribution (i.e., Idefect) to overall standby current.

SUMMARY OF THE INVENTION

The present invention can include a memory circuit having a plurality of sense amplifiers having a predetermined pitch in a first direction. In addition, a plurality of programmable element controlled devices can be included that each fit within the pitch and isolate an associated bitline from the power supply through a corresponding sense amplifier circuit when disabled.

In this way, if a bitline includes a defect that may draw current from the sense amplifier circuit, such a bitline can be electrically isolated. This can reduce, if not eliminate, a current component introduced by such a defect.

According to one aspect of the embodiments, programmable element controlled devices can comprise n-channel insulated gate field effect (IGFET) transistors laid-out within the pitch of the corresponding sense amplifier.

Such an arrangement can provide isolation capabilities that can be incorporated into existing design without unduly affecting device (e.g., die) size in the sense amplifier pitch direction.

According to another aspect of the embodiments, each programmable element controlled device includes a first n-channel IGFET having a source-drain path coupled between a first bitline of a bitline pair and the corresponding sense amplifier, and a second n-channel IGFET having a source-drain path coupled between a second bitline of the bitline pair and the corresponding sense amplifier.

Such an arrangement can reduce/eliminate defect current in memory device architectures having bitlines arranged into bitline pairs.

According to another aspect of the embodiments, each bitline can be coupled to a plurality of memory cells. Such memory cells can include any from the following list: one transistor dynamic random access memory (DRAM) type cells, magnetoresistive RAM (MRAM) cells, thyristor RAM (TRAM) cells, and ferromagnetic RAM (FRAM) cells.

In this way, the reductions in defect current can be applied to memory devices aimed at low power applications, where such savings may be particularly valuable.

According to another aspect of the embodiments, the bitlines can include folded bitline pairs, each bitline pair of a bitline pair being arranged parallel and adjacent to one another.

In this way, the reduction/elimination of defect standby current can be applied to folded bitline architectures.

According to another aspect of the embodiments, the bitlines can include open bitline pairs, with one bitline of each pair extending over one array section and the other bitline of each pair extending over a different array section.

In this way, the reduction/elimination of defect standby current can be applied to open bitline architectures.

According to another aspect of the embodiments, the bitlines can include unpaired bitlines, each coupled to a sense amplifier circuit that also receives a reference value to compare with a data signal provided by each bitline.

In this way, the reduction/elimination of defect standby current can be applied to single bitline architectures.

According to another aspect of the embodiments, the bitlines can be arranged into logical groups each including a plurality of bitline pairs. In addition, the programmable element controlled devices associated with each logical group are commonly disabled in response to the same control signal.

In this way, bitlines can be isolated in a group-wise fashion. Such an arrangement may be more compatible with many existing redundancy approaches that disable groups of bit lines in a replacement/repair operation.

The invention may also include a method of reducing a standby current contribution in conductive lines of a memory device. The method includes providing at least one transistor between each of a plurality of conductive lines arranged in a first direction within a memory cell array and a corresponding circuit coupled to the conductive line. A fuse-type element can be programmed to generate a control signal first value if an associated conductive line is determined to have a defect. The method also includes disabling each transistor when the associated control signal has the first value to prevent the standby current from flowing through the transistor from the corresponding conductive line.

In this way, conductive lines can be isolated according to a fuse-type element, enabling such conductive lines to be isolated in an essentially permanent fashion.

According to another aspect of the embodiments, the step of programming a fuse-type element is performed in a wafer test procedure.

Such an arrangement can allow such isolation programming to be performed with other wafer test programming (e.g., redundancy programming).

According to another aspect of the embodiments, the step of providing at least one transistor includes providing at least one transistor between a bitline and a corresponding sense amplifier circuit. More particularly, such a transistor can be provided between an equalization circuit within the sense amplifier circuit and a corresponding bit line. Alternatively, such a step can include providing at least one transistor between a wordline and a corresponding wordline driver circuit.

The present invention can also include a circuit for reducing standby current in a memory device. The circuit can include a plurality of first conductive lines parallel to one another, each first conductive line coupled to a plurality of memory cells in a memory cell array. A plurality of first circuits can be arranged on at least one side of the memory array, each first circuit coupled to at least one associated first conductive line and having a same first pitch in a first direction. A plurality of first isolation circuits can be included that each permanently isolates a corresponding first circuit from the associated at least one first conductive line when activated. Each first circuit can fit within the first pitch.

According to one aspect of the embodiments, a plurality of first conductive lines can include bitlines commonly coupled to memory cells of the same column in the memory cell array. In addition, the plurality of first circuits can include sense amplifier circuits for driving an associated bitline according to a data value on such bitline.

In addition or alternatively, a memory device can include wordlines commonly coupled to memory cells of the same row in the memory cell array. Second isolation circuits can isolate wordline driver circuits from such wordlines.

According to another aspect of the embodiments, a circuit can also include at least one fuse circuit for providing an activation signal according to the state of at least one fuse-type element. Each isolation circuit can include at least one transistor. Such a transistor can have a gate coupled to the activation signal.

According to another aspect of the embodiments, the isolation circuit can include a plurality of transistors having gates commonly coupled to the activation signal.

According to another aspect of the embodiments, a fuse-type element is selected from the group consisting of: a fusible link alterable to have a conducting or a non-conducting states, an anti-fuse structure alterable to have a conducting or a non-conducting states, an electrically programmable memory cell programmable to have a conducting or a non-conducting states.

BRIEF DESCRIPTION OF THE DRAWINGS

FIG. 4 is a block schematic diagram of a fourth embodiment of the present invention.

FIG. 5 is a block schematic diagram of a fifth embodiment of the present invention.

FIG. 6 is a block schematic diagram of a sixth embodiment of the present invention.

FIG. 7 is a block schematic diagram of a seventh embodiment of the present invention.

DETAILED DESCRIPTION

Figure 1:
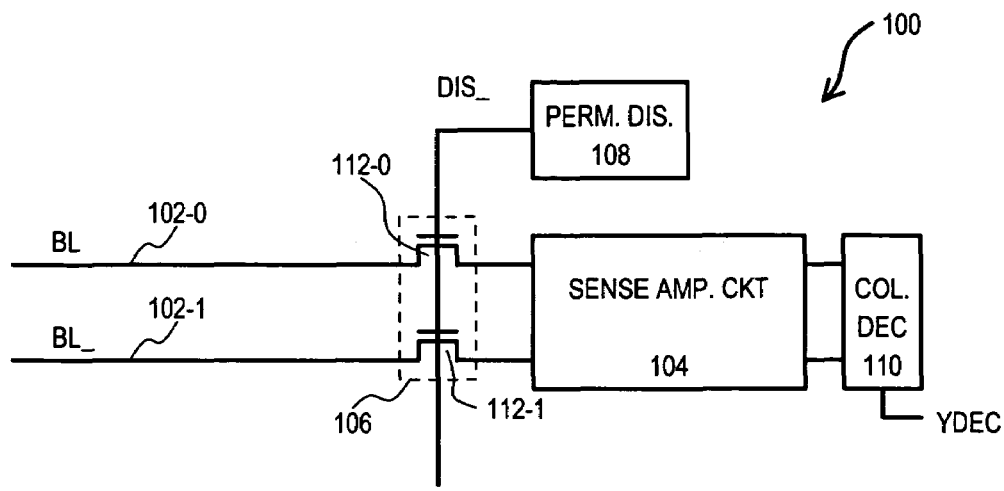
FIG. 1 is a block schematic diagram of a first embodiment of the present invention.

Various embodiments of the present invention will now be described in detail with reference to a number of drawings. The embodiments include circuits and methods for reducing a defect current component of a standby current. The method and circuits can isolate conductive array lines containing defects from potential current sources.

A first embodiment of the present invention is a circuit that can isolate complementary bitline pairs from current sourcing circuits, such as those included in an associated sense amplifier circuit. A first embodiment is shown in FIG. 1 and designated by the general reference character 100.

FIG. 1 shows a portion of a memory device that includes a bitline pair, including a "true" bitline (BL) 102-0, a "complement" bitline (BL_) 102-1 connected to a sense amplifier circuit 104 by controllable device circuit 106. Controllable device circuit 106 can be controlled according to a permanent option circuit 108. Further, a sense amplifier circuit 104 can provide an output to other data path circuits, such as a column decoder 110, as but one example.

In the embodiment of FIG. 1, controllable device circuit 106 can include controllable devices (112-0 and 112-1) connected between each bitline (BL and its complement, BL_) and associated sense amplifier circuit 104 (Sense Amp).

High-density memory designs, such as dynamic random access (DRAM) type designs can result in a relatively compact layout arrangement. Further, sense amplifiers circuits (e.g., 104) can be a repeated structure that results in a sense amplifier "pitch" that may limit at least one chip dimension.

Thus, it is desirable for any additional devices corresponding to sense amplifier circuits to fit within a sense amplifier pitch, typically defined according to an optimal sense amplifier layout design. Thus, while the embodiment of FIG. 1 provides controllable devices (112-0 and 112-1) capable of switching a leakage current path on and off, a feature of the embodiment is that such devices fit within a sense amplifier pitch. To meet such a layout restriction, the embodiment of FIG. 1 includes n-channel metal-oxide-semiconductor (MOS) type transistors as controllable devices (112-0 and 112-1) sized to fit within one sense amplifier pitch.

A sense amplifier circuit 104 may include not only a sense amplifier, but additional circuits as well, including but not limited to a precharge circuit and/or equalization circuit. Accordingly, a sense amplifier circuit 104 can provide a leakage current source (or sink) in the event a defect occurs that affects either or both bitlines (102-0 and 102-1).

A column decoder 110 can include a data path enabled in response to a decoder signal YDEC. A decoder signal YDEC may be activated in response to an applied address.

A permanent option circuit 108 can provide a disable signal (DIS_) to controllable device circuit 106. If bitlines (102-0 and 102-1) are determined to be defect free, or free from current drawing defects, a disable signal (DIS_) can remain in an active state (high), thus enabling a current path between bitlines (102-0 and 102-1) and the sense amplifier 104. If bit lines (102-0 and 102-1) are determined to be affected by a defect, a permanent option circuit 108 can drive disable signal (DIS_) to an inactive state (low), isolating bitlines (102-0 and 102-1) from corresponding sense amplifier circuit 104 by operation of controllable device circuit 106.

It is understood that permanent option circuit 108 can provide a disable signal in an essentially permanent fashion. That is, once configured to provide an active disable signal (DIS_), permanent option circuit 108 will continue to provide such a signal at essentially all times that power is supplied to the device. That is, the active disable can be permanent. As will be described in more detail below, such a permanent option can be achieved by a number of options, such as one or more programmable elements, like fusible links as but one example.

In this way, a first embodiment can isolate leakage paths flowing through bitlines in an essentially permanent fashion, thus reducing if not eliminating any defect current component introduced by such bitlines. Thus, permanent option circuit 108 can operate in a clearly different fashion than decoder circuits and conventional redundancy circuits that generate signals in response to an applied address.

While the above first embodiment shows one example where bitlines are isolated from a current source, such an approach may be used to isolate all or certain groups of memory device lines from associated circuits. One such approach is shown in FIG. 2.

Figure 2:
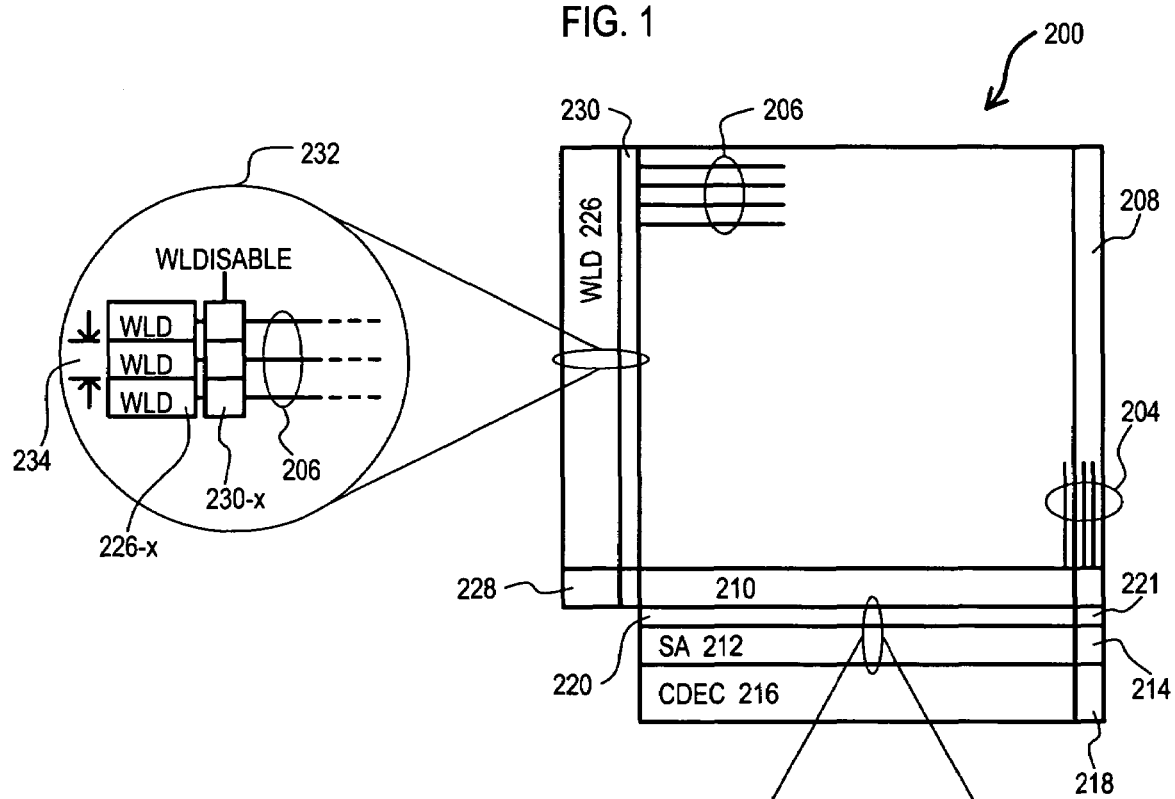
FIG. 2 is a top plan view of a second embodiment of the present invention.

FIG. 2 is a top plan view showing a memory device having isolation devices for multiple types of circuits. Memory device 200 can include a memory cell array 202 having a memory cells (not shown) arranged in a matrix, or the like. Various conductive lines can be arranged within the array, connected to the memory cells. FIG. 2 shows bitlines 204 arranged in a first direction over memory cell array 202. Only a portion of the bitlines 204 is shown, it being understood that such bitlines can extend over essentially all of the array in one direction (vertically in FIG. 2). Bitlines 204 can be connected to a number of memory cells, such as a column of memory cells.

FIG. 2 also shows a second set of conductive lines: wordlines 206 arranged in a second direction over memory cell array 202. Again, only a portion of the wordlines 206 is shown, it being understood that such wordlines can extend over essentially all of the array in one direction (horizontally in FIG. 2). Wordlines 206 can be connected to a number of memory cells, such as a row of memory cells.

Memory cell array 202 can include redundant columns 208 as well as redundant rows 210. A redundant column 208 (or group of redundant columns) can be used to replace a normal column (or group of normal columns). Similarly, a redundant row 210 (or group of redundant rows) can be used to replace a normal row (or group of normal rows).

One side of memory cell array 202 can be conventional circuits for accessing memory cells in a column-wise fashion. In particular, one side of memory cell array 202 can include sense amplifiers 212 along with redundant sense amplifiers 214, and column decoders 216 along with redundant column decoders 218.

However, unlike conventional memory device arrangements, memory device 200 also includes first controllable disable circuits 220 situated between bitlines 204 and sense amplifier circuits (212 and 214).

FIG. 2 includes a magnified view 222 of one side of memory cell array 202. The magnified view 222 shows how an arrangement like that of FIG. 1 can be repeated in a column wise direction. Shown in magnified view 222 are bitlines 204 connected to sense amplifier circuits (one of which is labeled 212-y) by first controllable disable circuits (one of which is labeled 220-y). Magnified view 222 also shows a sense amplifier circuit pitch 224, and illustrates how first controllable disable circuits 220 each fit within such a first pitch 224.

Referring still to FIG. 2, a second side of memory cell array 202 can include conventional circuits for accessing memory cells in a row-wise fashion. In particular, a second side of memory cell array 202 can include wordline driver circuits 226 along with redundant wordline driver circuits 228.

However, unlike conventional memory device arrangements, memory device 200 also includes second controllable disable circuits 230 situated between wordlines 206 and wordline driver circuits (226 and 228).

FIG. 2 includes a magnified view 232 of the second side of memory cell array 202. The magnified view 232 shows how second controllable disable circuits can be repeated in a row wise direction. Shown in magnified view 232 are wordlines 206 connected to wordline driver circuits (one of which is labeled 226-x) by second controllable disable circuits (one of which is labeled 230-x). Magnified view 232 also shows a wordline driver circuit (e.g., a second) pitch 234, and illustrates how second controllable disable circuits 230 each fit within such a second pitch 234.

In this way, a memory device can include first controllable disable circuits for isolating defective first conductive lines (e.g., bitlines) from drawing a defect leakage current, or can include second controllable disable circuits for isolating defective second conductive lines (e.g., wordlines) from drawing a defect leakage current, or can include both.

A third embodiment of the present invention will now be described with reference to FIG. 3.

Figure 3:
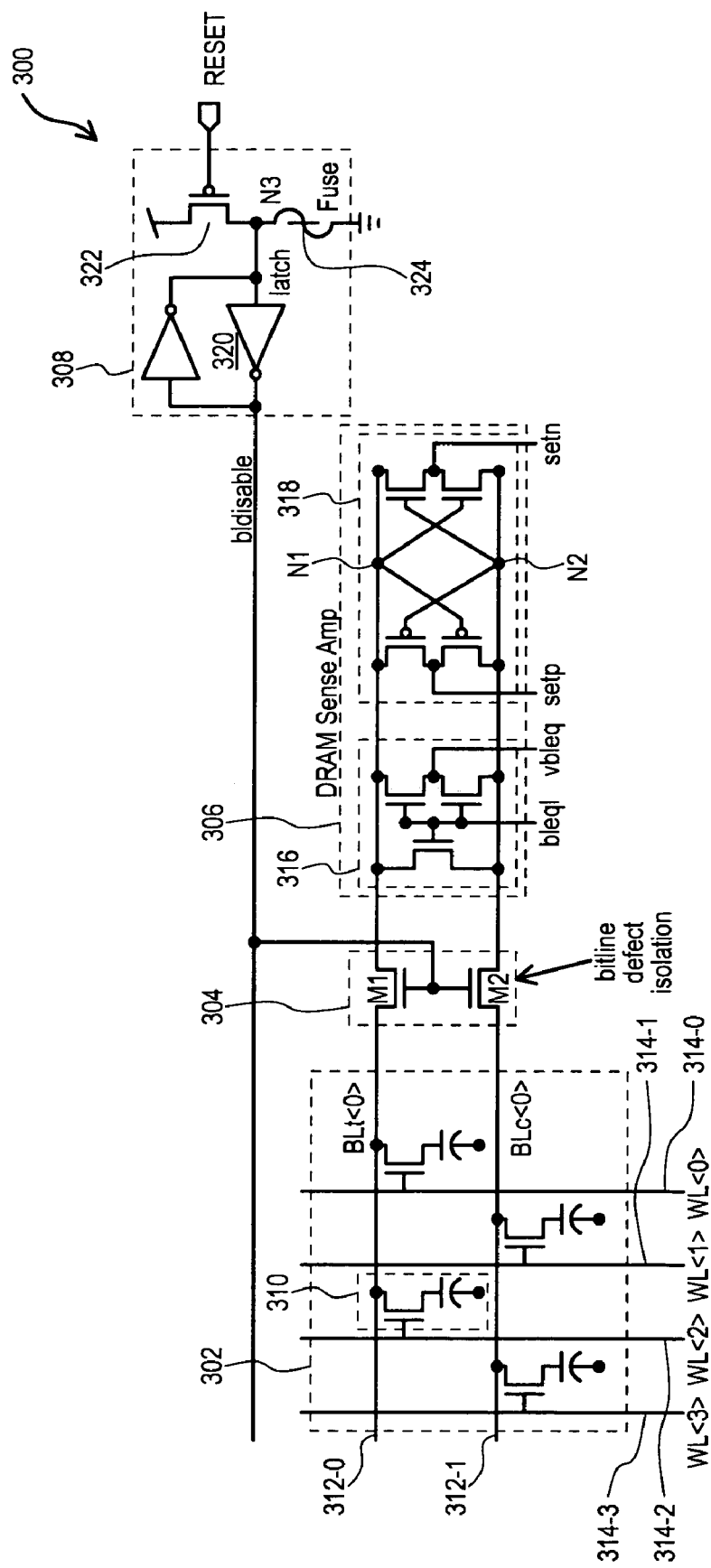
FIG. 3 is a schematic diagram of a third embodiment of the present invention.

FIG. 3 is a detailed schematic diagram of a circuit that can isolate a complementary bitline pair from a sense amplifier circuit. The third embodiment is designated by the general reference character 300, and shows a portion of a memory cell array 302, an isolation circuit 304, a sense amplifier circuit 306, and a permanent option circuit 308.

Memory cell array portion 302 shows a number of memory cells (one of which is shown as 310) arranged in a matrix, a complementary bitline pair (312-0 and 312-1), as well as wordlines 314-0 to 310-3. A memory cell array portion 302 may preferably draw a lower amount of power than other memory cell array type. Accordingly, in the embodiment of FIG. 3, a memory cell array 302 can be a DRAM type array, suitable in a low power DRAM device or a pseudo-SRAM device.

The present invention can be particularly applicable to low-power applications in which defect induced currents can be a considerable issue. Accordingly, a memory cell array 302 could include other types of memory cells for lower power devices, including but not limited to magneto resistive RAM (MRAM) cells, thyristor RAM (TRAM) cells, and ferromagnetic RAM (FRAM) cells.

Of course, the present invention could also be applied to other types of memory devices, including but not limited to those that include static RAM (SRAM) type cells and electrically erasable programmable read-only-memory (EEPROM) cells.

Isolation circuit 304 can include two n-channel transistors (M1 and M2) arranged in parallel with one another. A first n-channel transistor M1 can have a source-drain path arranged between a "true" bitline 312-0 and a first sense amplifier circuit node N1. A second n-channel transistor M2 can have a source-drain path arranged between a "complement" bitline 312-1 and a second sense amplifier circuit node N2. Gates of both transistors (M1 and M2) can be controlled according to a bitline disable signal (bldisable).

A sense amplifier circuit 306 can include an equalization circuit 316 and a sense amplifier 318. An equalization circuit 316 can be enabled and disabled according to an equalization signal (bleql). When enabled (e.g., bleql high), equalization circuit 316 can essentially short the bitlines (312-0 and 312-1) to one another, and provide an equalization voltage (vbleq) to the bitlines (312-0 and 312-1). When disabled, (e.g., bleql low), equalization circuit 316 can present a high impedance between the bitlines (312-0 and 312-1). A sense amplifier 318 can amplify a differential voltage appearing between bitlines (312-0 and 312-1) when enabled by sense amplifier enable signals (setp and setn).

A permanent option circuit 308 can establish a bitline disable signal (bldisable) in an essentially permanent fashion. The particular permanent option circuit 308 of FIG. 3 can include a latch 320 composed of cross-coupled inverters. A latch 320 can have an output that provides bitline disable signal (bldisable) and an input connected to a set node N3. A potential at set node N3 can be established according to reset device 322 and programmable element 324. A reset device 322 can be weak pull-up device activated according to a reset signal. In the particular case of FIG. 3, a reset device 322 can include a p-channel transistor. A programmable element 324 can be programmed to provide a relatively low impedance or high impedance path with respect to node N3. In the particular case of FIG. 3, a programmable element 324 can include a fusible link that can be opened ("blown") via laser irradiation, or other methods.

In operation, if programmable element 324 presents a low impedance, when a reset signal pulses low, reset device 322 will not overpower programmable elements 324, and latch 320 will latch a high bitline disable signal (bldisable). Conversely, if programmable element 324 presents a high impedance, when a reset signal pulses low, reset device 322 will pull set node N3 high, and latch 320 will latch a low bitline disable signal (bldisable).

Of course, the present invention should not be limited to any particular programmable element type. While, FIG. 3 illustrates a fusible link, other option techniques could be used, including but not limited to laser blown fuses, current blown fuses, anti-fuses, and electrically programmable elements, such as EEPROM cells, and the like.

The operation of the circuit of FIG. 3 will now be described.

After a memory device has been manufactured, such a memory device can be tested to determine if any defects are present that affect bitlines and/or wordlines. If such a defect is detected that affects a bitline (312-0 or 312-1, or both), such bitlines (312-0 or 312-1, or both) may be replaced by operation of conventional redundancy techniques.

However, unlike conventional redundancy approaches, a programmable element 324 can be set to a non-conducting (high impedance) state (i.e., the fuse can be blown). Accordingly, when a reset signal pulses low, the output of latch 320 can be driven low, and bitline disable signal (bldisable) can be low.

With bitline disable signal (bldisable) low, transistors M1 and M2 within isolation circuit 304 can be turned off, isolating bitlines (312-0 or 312-1) from sense amplifier circuit 306, and hence isolating bitlines from a potential current source/sink.

One skilled in the art would recognize that the above embodiments have illustrated a "folded" bitline arrangement, in which true and complementary bitlines are arranged adjacent to one another. The present invention should not necessarily be limited to such a configuration. Two of the many possible variations are shown in FIGS. 4 and 5.

FIG. 4 shows an "open" bitline configuration. FIG. 4 can include some components corresponding to those set forth in FIG. 3. Accordingly, like components will be referred to by the same reference character but with the first digit being a "4" instead of a "3".

FIG. 4 shows a portion of a memory device 400 and includes a sense amplifier circuit 406. Sense amplifier circuit 406 can be isolated from associated bitlines (412-0 and 412-1). However, a true bitline 412-0 can be formed over a first array portion 402-a while a complement bitline 412-1 can be formed over a second, different array portion 402-b. Thus, within isolation circuit 404, a first n-channel transistor M1' can be situated between a first array portion 402-a and sense amplifier circuit 406, while a second n-channel transistor M2' can be situated between a second array portion 402-b and sense amplifier circuit 406.

FIG. 5 shows a single bitline configuration. FIG. 5 can include some components corresponding to those set forth in FIG. 3. Accordingly, like components will be referred to by the same reference character but with the first digit being a "5" instead of a "3".

FIG. 5 shows a portion of a memory device 500 and includes a sense amplifier circuit 506. In the arrangement shown, only one bitline 512 can be associated with a sense amplifier circuit 506. Accordingly, an isolation circuit 504 can include one n-channel transistor M1" having a source-drain path between bitline 512 and its associated sense amplifier circuit 506.

Such an arrangement may be utilized in memory devices that typically include single bit lines, such as some EEPROMs architectures. It is understood that sense amplifier circuit 506 would receive a reference value for comparison with a data value from the associated bitline. For example, if sense amplifier circuit 506 includes a voltage sense amplifier, sense amplifier circuit 506 can receive a reference voltage. Similarly, if sense amplifier circuit 506 includes a current sense amplifier, sense amplifier circuit 506 can receive a reference current.

It is understood that while some of the embodiments have illustrated a single bitline, bitline pair, or single wordline, the present invention can include the disabling such conductive lines in a group-wise fashion.

Two examples of group-wise isolation of defect induced current are shown in FIGS. 6 and 7. FIG. 6 shows a portion of memory device 600 and includes similar components to FIG. 3. Accordingly, like components will be referred to by the same reference character but with the first digit being a "6" instead of a "3".

Memory device portion 600 shows multiple isolation circuits 604-0 to 604-$n$ that commonly isolate bitline pairs 612-00/01 to 612-$n$0/$n$1 from corresponding sense amplifier circuits 606-0 to 606-$n$, respectively. In such an arrangement, when bitline disable signal (BLDISABLE) is low (due to a permanent option circuit), any defect induced current that would flow on any of bitlines (612-00/01 to 612-$n$0/$n$1) can be essentially eliminated. Such an arrangement may be applicable to redundancy schemes that enable/disable groups of bitlines (e.g., groups of columns).

It is noted that a group of commonly activated isolation circuits (604-0 to 604-$n$) need not be adjacent to one another. In many architectures, a group of redundant bitlines may replace a group of normal bit lines that are spaced from one another within an array (e.g., every fourth bitline, every eighth bitline, etc. . . . ). Thus, while FIG. 6 shows multiple isolation circuits (604-0 to 604-$n$) adjacent to one another, the invention is by no means limited to such an arrangement.

FIG. 7 shows a portion of memory device 700 including wordline driver circuits (702-0 to 702-$m$) connected to corresponding wordlines (706-0 to 706-$m$) by isolation circuits (704-0 to 704-$m$), respectively. Each wordline (706-0 to 706-$m$) can be commonly connected to a row of memory cells, one of which is shown as 708. Each isolation circuit (704-0 to 704-$m$) can include an n-channel transistor, the gates of such transistors being commonly connected to a wordline disable signal (WLDISABLE). In such an arrangement, when wordline disable signal (WLDISABLE) is low (due to a permanent option circuit), any defect induced current that would flow on wordlines (706-0 to 706-$m$) can be essentially eliminated. Such an arrangement may be applicable to redundancy schemes that enable/disable groups of wordlines (e.g., groups of rows).

As in the case of the FIG. 6, commonly activated isolation circuits (704-0 to 704-$m$) need not be adjacent to one another.

The above embodiments have described arrangements in which permanent isolation of conductive lines may be accomplished by setting the state of a programmable element, such as a fuse. Such programming can preferably be done as part of a wafer test procedure (i.e., a test performed at wafer level as opposed to a single sliced die or a packaged die). Such an arrangement can be preferable because at this stage other programming can be performed, such as an initial redundancy programming step (prior to a determination that any redundant elements may be defective).

It is also noted that in either a bitline defect case or wordline defect case, the defective element portion that is cut-off (e.g., isolated) may have some initial floating as the element is no longer actively driven by a sense amplifier circuit or the wordline driver circuit. But, based upon the particular type of defect, such an element portion may be resistively tied to another element (e.g., the other bitline in a bitline-to-bitline short or the other wordline in a wordline-to-wordline type of short) and as a result, no DC current will flow through. Thus, the standby current contribution can be essentially eliminated from this particular defective element.

Figure 8:
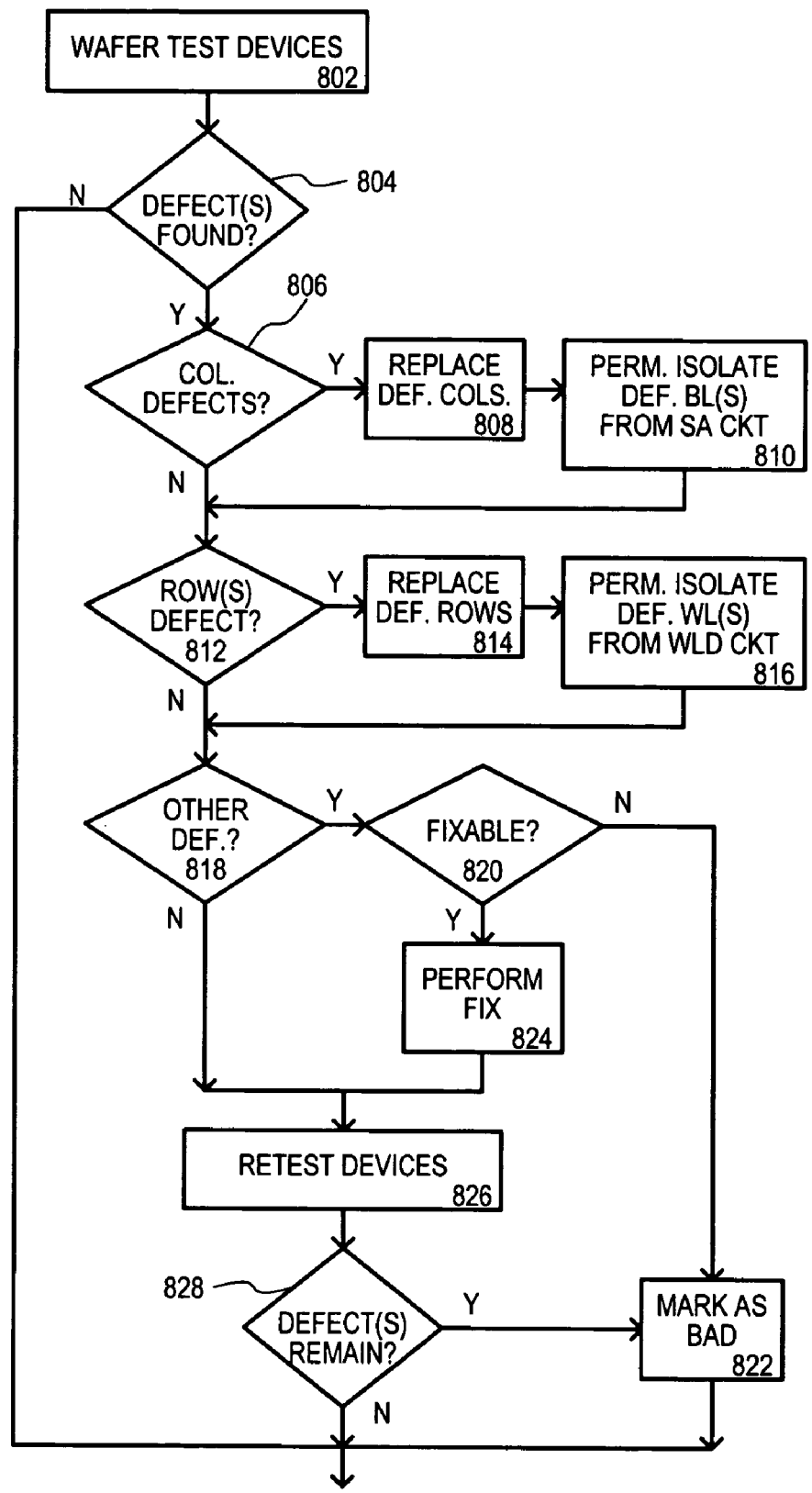
FIG. 8 is a flow diagram of a method according to another embodiment of the present invention.
Figure 9:
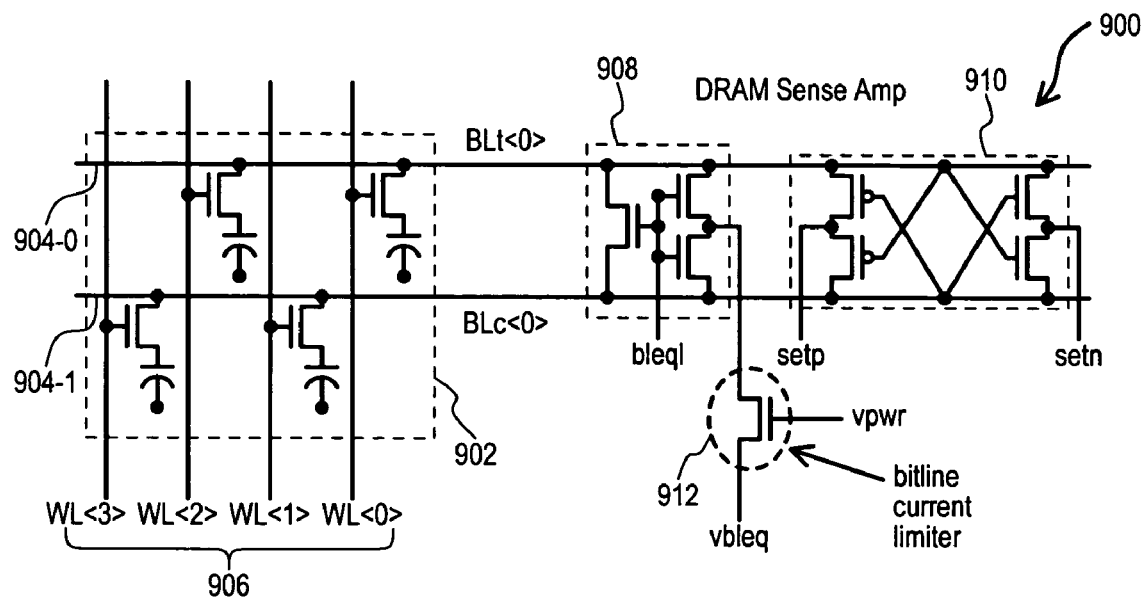
FIG. 9 is a schematic diagram showing a portion of a conventional DRAM device.

A method for isolating defective bitlines and/or wordlines will now be described with reference to FIG. 8. FIG. 8 is a flow diagram 800 of a general wafer test procedure. FIG. 8 includes performing a wafer test (step 802). Such a step can include executing a number of predetermined electrical tests on automatic test equipment (ATE) to determine if any memory devices on the wafer include a defect (step 804).

If there are no defects, a wafer may be sliced and packaged. If a defect is found, repair may be attempted according to type of defect. If a defect is a column defect (step 806), a defective column (or columns) can be replaced (step 808). Unlike conventional testing arrangements, defective bitlines can be permanently isolated from associated sense amplifier circuits (step 810).

If a defect is a row defect (step 812), a defective row (or rows) can be replaced (step 814). Further, and again unlike conventional testing arrangements, defective wordlines bitlines can be permanently isolated from associated wordline driver circuits (step 816).

If other defects remain present (step 818), such defects can be fixed, if feasible (step 820), otherwise the device having such additional defect can be marked as defective (i.e., "inked") (step 822).

Repaired devices may then be retested (step 826), and if defects remain, such devices can be marked as defective (step 822).

Of course, the method shown in FIG. 8 represents but one approach, and so should not be construed as limiting the invention thereto. As but one example, only bitline isolation or only wordline isolation may be performed.

The embodiments disclosed herein can provide advantages over other known approaches by eliminating the standby power due to certain array type defects. The embodiments described can utilize on-pitch programmable element (e.g., fuse) controlled devices to isolate defects. This approach can be valuable for memory devices (e.g., DRAMs) for use in a low current applications.

The methods and apparatuses of the embodiments may be best suited for use in emerging process technologies and where the yield benefit analysis favors the additional fuse area approach.

Many of the embodiments above have shown the use of n-channel transistors for isolating conductive lines from current source/sink circuits. However, the particular conductivity of such transistors should not necessarily be construed as being limited to n-type.

Further, in the case n-channel transistors are employed as isolation devices, it may be desirable to drive the gates of such devices with a "booted" voltage (a voltage higher than that achievable by a sense amplifier) in order to limit any limitations in maximum voltage presented by the inherent threshold voltage of such devices.

It is understood that other embodiments of this invention may be practiced in the absence of an element/step disclosed or not specifically disclosed herein.

Accordingly, while the various aspects of the particular embodiments set forth herein have been described in detail, the present invention could be subject to various changes, substitutions, and alterations without departing from the spirit and scope of the invention.

What is claimed is:

1. A memory circuit, comprising:
a plurality of sense amplifier circuits having a predetermined pitch in a first direction; and
a plurality of programmable element controlled devices, each programmable element controlled device fitting within the pitch and isolating at least one associated bitline from a corresponding sense amplifier circuit when disabled.

2. The memory circuit of claim 1, wherein:
the programmable element controlled devices comprise n-channel insulated gate field effect (IGFET) transistors laid-out within the pitch of the corresponding sense amplifier.

3. The memory circuit of claim 2, wherein:
each of programmable element controlled devices includes
a first n-channel IGFET having a source-drain path coupled between a first bitline of a bitline pair and the corresponding sense amplifier circuit, and
a second n-channel IGFET having a source-drain path coupled between a second bitline of the bitline pair and the corresponding sense amplifier circuit.

4. The memory circuit of claim 1, wherein:
each bitline is coupled to a plurality of memory cells selected from the group consisting of one transistor dynamic random access memory (DRAM) type cells, magnetoresistive RAM (MRAM) cells, thyristor RAM (TRAM) cells, and ferromagnetic RAM (FRAM) cells.

5. The memory circuit of claim 1, wherein;
the bitlines comprise folded bitline pairs, each bitline of a bitline pair being arranged parallel and adjacent to one another.

6. The memory circuit of claim 1, wherein:
the bitlines comprise open bitline pairs, with one bitline of each pair extending over one array section and the other bitline of each pair extending over a different array section.

7. The memory circuit of claim 1, wherein:
the bitlines comprise unpaired bitlines, each coupled to a sense amplifier circuit that also receives a reference value to compare with a data signal provided by each bitline.

8. The memory circuit of claim 1, wherein:
the bitlines are arranged into logical groups each including a plurality of bitline pairs; and
the programmable element controlled devices associated with each logical group are commonly disabled in response to the same control signal.

9. A circuit for reducing defect induced standby current in a memory device, comprising:
a plurality of first conductive lines parallel to one another, each first conductive line coupled to a plurality of memory cells in a memory cell array;
a plurality of first circuits arranged on at least one side of the memory array, each first circuit being associated with at least one associated first conductive line and having a same first pitch in a first direction; and
a plurality of first isolation circuits, each first isolation circuit permanently isolating a corresponding first circuit from the associated at least one first conductive line when activated and fitting within the first pitch.

10. The circuit of claim 9, wherein:
the plurality of first conductive lines comprise bitlines commonly coupled to memory cells of the same column in the memory cell array; and
the plurality of first circuits comprise sense amplifier circuits for driving an associated bitline according to a data value on such bitline.

11. The circuit of claim 10 further including:
a plurality of wordlines parallel to one another, each wordline coupled to memory cells of the same row;
a plurality of wordline driver circuits arranged on at least a second side of the memory array, each wordline driver circuit coupled to at least one of the wordlines and having the same pitch in a second; and
a plurality of second isolation circuits, each second isolation circuit permanently isolating a corresponding wordline driver circuit from the associated wordline when activated.

12. The circuit of claim 9, wherein:
the plurality of first conductive lines comprise wordlines commonly coupled to memory cells of the same row in the memory cell array; and
the plurality of first circuits comprises wordline driver circuits for driving an associated wordline according to an applied address value.

13. The circuit of claim 9, further including:
at least one fuse circuit for providing an activation signal according to the state of at least one fuse-type element; and
each isolation circuit comprises at least one transistor having a gate coupled to the activation signal.

14. The circuit of claim 13, wherein:
the isolation circuit includes a plurality of transistors having gates commonly coupled to the activation signal.

15. The circuit of claim 13, wherein:
the fuse-type element is selected from the group consisting of: a fusible link alterable to have a conducting or a non-conducting state, an anti-fuse structure alterable to have a conducting or a non-conducting state, an electrically programmable memory cell programmable to have a conducting or a non-conducting state.

* * * * *